(12) United States Patent
Leussler et al.

(10) Patent No.: US 10,488,473 B2
(45) Date of Patent: Nov. 26, 2019

(54) METHOD AND DETECTING UNIT FOR DETECTING METAL IMPLANTS AND SELECTING MAGNETIC RESONANCE PULSE SEQUENCES FOR EFFICIENT MRI WORKFLOW

(71) Applicant: KONINKLIJKE PHILIPS N.V., Eindhoven (NL)

(72) Inventors: Christoph Leussler, Eindhoven (NL); Christian Findeklee, Eindhoven (NL); Peter Vernickel, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 155 days.

(21) Appl. No.: 15/737,350

(22) PCT Filed: Jun. 8, 2016

(86) PCT No.: PCT/EP2016/062929
§ 371 (c)(1),
(2) Date: Dec. 18, 2017

(87) PCT Pub. No.: WO2016/206969
PCT Pub. Date: Dec. 29, 2016

(65) Prior Publication Data
US 2018/0172785 A1    Jun. 21, 2018

(30) Foreign Application Priority Data
Jun. 26, 2015   (EP) .................................... 15174017

(51) Int. Cl.
*G01R 33/28* (2006.01)
*G01R 33/3415* (2006.01)
(Continued)

(52) U.S. Cl.
CPC ....... *G01R 33/288* (2013.01); *G01R 33/3415* (2013.01); *G01R 33/3607* (2013.01); *G01R 33/543* (2013.01)

(58) Field of Classification Search
CPC ................ G01R 33/288; G01R 33/341; G01R 33/3415; G01R 33/3607; G01R 33/543; G01R 33/546
See application file for complete search history.

(56) References Cited

U.S. PATENT DOCUMENTS 7,218,105 B2 * 5/2007 Chisholm ............ G01R 33/441
324/307
7,327,137 B1 * 2/2008 Crowley ................ G01N 24/08
324/300
(Continued)

FOREIGN PATENT DOCUMENTS

JP        01223946 A     9/1989

OTHER PUBLICATIONS

Atalar et al: "Radiofrequency Safety for Interventional MRI Procedures", Academic Radiology, Reston, VA, US, vol. 12, No. 9, Sep. 1, 2005 (Sep. 1, 2005), pp. 1149-1157.
(Continued)

*Primary Examiner* — Dixomara Vargas

(57) ABSTRACT

A magnetic resonance imaging system (10) comprising at least one magnetic resonance radio frequency antenna device (30) and at least one metal detector unit (38) for detecting metal within the subject of interest (20) including at least one metal detector coil (40), wherein the at least one magnetic resonance radio frequency antenna device (30) and the at least one metal detector coil (40) mechanically or electrically or spatially form an integral unit (34); and a method of operating, with regard to detecting metal-comprising implants (36) and selecting magnetic resonance (Continued)

pulse sequences, such magnetic resonance imaging system (10).

12 Claims, 6 Drawing Sheets

(51) Int. Cl.
*G01R 33/36* (2006.01)
*G01R 33/54* (2006.01)

(56) References Cited

U.S. PATENT DOCUMENTS

| | | | | |
|---|---|---|---|---|
| 7,538,671 | B2* | 5/2009 | Maschke | G01R 33/28 340/541 |
| 2004/0135687 | A1 | 7/2004 | Keene | |
| 2004/0245988 | A1* | 12/2004 | Laubacher | G01R 33/341 324/316 |
| 2005/0225327 | A1* | 10/2005 | Maschke | G01R 33/28 324/318 |
| 2008/0012560 | A1 | 1/2008 | Crowley et al. | |
| 2010/0013795 | A1 | 1/2010 | Okino | |
| 2010/0189328 | A1* | 7/2010 | Boernert | G01R 33/56375 382/131 |
| 2011/0038516 | A1 | 2/2011 | Koehler et al. | |
| 2013/0088229 | A1 | 4/2013 | Van Den Brink | |
| 2013/0154636 | A1 | 6/2013 | Takami et al. | |
| 2015/0196222 | A1 | 7/2015 | Stehning et al. | |
| 2017/0234945 | A1* | 8/2017 | Findeklee | G01R 33/288 324/313 |

OTHER PUBLICATIONS

Brian A. Hargreaves et al: "Metal-Induced Artifacts in MRI", American Journal of Roentgenology, vol. 197, No. 3, Sep. 1, 2011 (Sep. 1, 2011), pp. 547-555.

Hargreaves B A et al: "Fat-Suppressed and Distortion-Corrected MRI Near Metallic Implants", Proceedings of the International Society for Magnetic Resonance in Medicine, 18th Scientific Meeting and Exhibition, Stockholm, Sweden, May 1-7, 2010, vol. 18, Apr. 17, 2010 (Apr. 17, 2010), p. 3084.

Field Strength, Philips Publication Summer 2011.

* cited by examiner

METHOD AND DETECTING UNIT FOR DETECTING METAL IMPLANTS AND SELECTING MAGNETIC RESONANCE PULSE SEQUENCES FOR EFFICIENT MRI WORKFLOW

CROSS REFERENCE TO RELATED APPLICATIONS

This application is a U.S. national phase application of International Application No. PCT/EP2016/062929, filed on Jun. 8, 2016, which claims the benefit of EP Application Serial No. 15174017.2 filed on Jun. 26, 2015 and is incorporated herein by reference.

FIELD OF THE INVENTION

The invention pertains to a magnetic resonance imaging system with a metal detector unit for detecting metal within a subject of interest to be imaged, and a method for detecting metal implants and selecting magnetic resonance pulse sequences in case of a detected metal implant.

BACKGROUND OF THE INVENTION

In the art of magnetic resonance imaging metal-comprising implants are known to pose issues that require careful consideration. Implants like internal fixations, artificial joints, or pacemakers are typically made of highly electrically conductive metal, in which eddy currents may be excited inside a scanning unit of a magnetic resonance imaging system, mainly caused by the radio frequency magnetic excitation field $B_1$ required for resonantly exciting nuclei of or within a subject of interest to be examined.

Magnetic resonance imaging near metal is typically compromised by susceptibility issues, locally degrading the magnetic fields used for image formation. In diagnostic magnetic resonance imaging scans, the susceptibility of the metal parts can cause magnetic resonance signal pile-up, signal voids and other geometric distortions, resulting in image artifacts.

Besides the generation of magnetic resonance imaging artifacts, the eddy currents excited in metal-comprising implants may substantially contribute to the specific absorption rate (SAR) that the subject of interest is exposed to during a magnetic resonance examination, and that is subject to limits from safety regulation requirements.

With aging population and an increasing number of patients carrying metal-comprising implants, the need for magnetic resonance imaging of soft tissue in the presence of metal increases.

SUMMARY OF THE INVENTION

The desire to apply magnetic resonance imaging (MRI) techniques in the vicinity of metal-comprising implants is increasing. The soft-tissue contrast available with magnetic resonance (MR) techniques is advantageous in supporting diagnosing complications near an increasing variety of MR-safe metal-comprising implant hardware.

It is therefore an object of the invention to provide a method of operating a magnetic resonance imaging system and such magnetic resonance imaging system that allows magnetic resonance imaging close to a metal-comprising implant while reducing an SAR load for the subject of interest to be examined.

The phrase "metal-comprising implant", as used in this application, shall in particular be understood to encompass medical implants comprising metallic as well as non-metallic constituents, and shall in particular encompass medical implants completely consisting of metal. Examples for metal-comprising implants include, but are not limited to, internal fixations, artificial joints, in particular artificial hip joints, and pacemakers.

In one aspect of the present invention, the object is achieved by a magnetic resonance imaging system that is configured for acquiring magnetic resonance images of at least a portion of a subject of interest, and that comprises
  at least one MR radio frequency antenna device that is designed as at least one out of
    an MR radio frequency surface transmit antenna connectable to a radio frequency transmitter and being configured for receiving radio frequency power from the radio frequency transmitter and for applying a radio frequency excitation field $B_1$ to nuclei of or within the portion of the subject of interest for magnetic resonance excitation, and
    an MR radio frequency surface receive antenna that is configured for receiving magnetic resonance signals from nuclei of or within the portion of the subject of interest that have been excited by applying a radio frequency excitation field $B_1$, and
  at least one metal detector unit for detecting metal within the subject of interest and including at least one metal detector coil, wherein the at least one MR radio frequency antenna device and the at least one metal detector coil mechanically or electrically or spatially form an integral unit.

The phrase "mechanically form an integral unit", as used in this application, shall be understood particularly as being attached to each other, being attached to the same carrier or being attached to individual carriers that are attached to each other.

The phrase "electrically form an integral unit", as used in this application, shall be understood particularly such that at least one transmission line is configured for conveying electrical signals from, to or within the at least one MR radio frequency antenna device and for conveying electrical signals from, to or within the at least one metal detector unit. The signals can be conveyed subsequently or simultaneously.

The phrase "spatially form an integral unit", as used in this application, shall be understood particularly as at least one out of being arranged in close proximity, being arranged in mechanical contact to each other and being arranged within a same enclosure.

In this way, a metal-comprising implant within the subject of interest to be examined and being located close to an imaging region of an MR radio frequency surface receive antenna or within a region of a radio frequency magnetic excitation field $B_1$ to be applied to the nuclei of or within the subject of interest can be detected prior to applying the radio frequency magnetic excitation field $B_1$, and measures can be taken in good time to avoid exposing the subject of interest to a large SAR and to avoid affecting the quality of a magnetic resonance image to be taken.

In a suitable embodiment, a search for a metal-comprising implant within the subject of interest can be carried out in an automated manner, and a warning indicating the detection of the metal-comprising implant can be visualized to an operator.

In a preferred embodiment, the at least one metal detector coil of the at least one metal detector unit has a detector coil area that is arranged in a plane parallel to an orientation plane of the at least one MR radio frequency surface receive antenna such that the detector coil area at least partially overlaps the at least one MR radio frequency surface receive antenna in a direction perpendicular to the orientation plane. The phrase "orientation plane", as used in this application, shall be understood particularly as a plane that the at least one MR radio frequency surface receive antenna can be thought of to at least partially lie within in case of a planar design or, in the case of the at least one MR radio frequency surface receive antenna being designed as a curved surface in space, as a tangential plane to a location within the at least one MR radio frequency surface receive antenna. In this way, metal-comprising implants within the subject of interest that are arranged close to or within the imaging region of the MR radio frequency surface receive antenna or within a region of the radio frequency magnetic excitation field $B_1$ to be applied to the nuclei of or within the subject of interest can readily be detected. The magnetic resonance radio frequency surface transmit and receive antennae may be tuned to be resonant in a high-frequency radio frequency band around the Larmor frequency for the nucleus at issue for the main magnetic field strength of the magnetic resonance imaging system. The magnetic resonance radio frequency surface transmit antenna may transmit the $B_1$-field in the high-frequency radio frequency band. The magnetic resonance radio frequency surface antenna may receive the magnetic resonance signals due to the excited nuclei in the high-frequency radio frequency band. The metal detector coil may be tuned to be resonant in a low-frequency radio frequency band around the fundamental frequency of the metal detector unit. The high-frequency radio frequency band may for example have a central frequency of 42.6 MHz/T for protons ($^1$H), 10.7 MHz/T ($^{13}$C), 40.1 MHz ($^{19}$F), 11.3 MHz/T ($^{23}$Na) or 17.2 MHZ/T ($^{31}$P). The low-frequency radio frequency band is around the fundamental frequency of the metal detector unit of for example about 2 MHz. As explained in more detail later, the magnetic resonance transmit antenna, surface receive antenna and metal detector may be formed from common or separate hardware components. The present invention achieves to independently optimise sensitivity for (i) magnetic resonance signals from the nuclei in the high frequency radio frequency band from which magnetic resonance images may be reconstructed and (ii) signals due to the metal object. This is further achieved in the integral unit which also may share hardware components for its different functions.

The surface transmit and receive antennae are tunable to be resonant in the Larmor frequency band (typically 10-42 MHz/T) and the metal detector coil is tunable to be resonant in a low-frequency radio frequency band (typically 0.1-10 MHz). The metal object is detected on the basis of induced eddy currents which cause induced signals in the frequency range of 0.1-10 MHz, which are detected by the metal detector coil. The frequency of the induced signals is dependent on the composition and size of the metal object to be detected and the induced signals have a high signal level in the range of 5-10 MHz. At frequencies above 10 MHz, RF wave propagation effects dominate over eddy current generation. Thus, the RF antenna device's sensitivity is independently optimised for detection of imaging magnetic resonance signal and of detection of metal objects.

Further, the present invention enables to detect metal objects in a patient to be examined outside the main magnetic field of the magnetic resonance examination system. Thus, metal objects may be detected prior to imaging, when the patient is positioned on the patient carrier, but still outside of the magnet's bore. This improves the efficiency of workflow.

In another preferred embodiment, the at least one MR radio frequency antenna device comprises a plurality of coils arranged as an MR radio frequency antenna array, and wherein the at least one metal detector unit comprises a plurality of metal detector coils arranged as a metal detector coil array. An MR radio frequency antenna array is known to provide the benefit of a large signal-to-noise ratio (SNR) of MR radio frequency surface antennas while covering a large imaging area. Arranging a plurality of metal detector coils as a metal detector coil array can beneficially facilitate detecting a metal-comprising implant within the subject of interest for the large imaging area of the MR radio frequency antenna array. The same benefit applies for magnetic resonance radio frequency transmit antennas arranged as an array.

In one preferred embodiment, electric signals from, to or within the at least one MR radio frequency antenna device and from, to or within at least one of the at least one metal detector coil are at least partially transferred via identical transmission lines. The magnetic resonance imaging system further comprises at least one electric filter member for directing the electrical signals from, to or within the at least one of the at least one MR radio frequency antenna device and from, to or within the at least one of the at least one metal detector coil. In this way, an amount of electronic noise potentially picked up by transmission lines from and to the at least one MR radio frequency antenna device and the at least one metal detector coil can beneficially be reduced.

Preferably, the at least one electric filter member includes at least one remotely switchable choke. The term "choke", as used in this application, shall in particular be understood as an inductor used to block higher-frequency alternating current in an electrical circuit, while passing lower-frequency or direct current (DC).

The remotely switchable choke may be designed to include a PIN diode that can be transferred between a state of low radio frequency impedance and a state of high radio frequency impedance by controlling a DC bias current. The choke can be switched "on" and "off" by the PIN diode. The MR radio frequency antenna device is tuned to the MRI resonant frequency, and thus the remotely switchable choke, in the "on" position, provides a high impedance during MR signal reception and MR radio frequency transmission.

At radio frequencies under consideration (42.6 MHz/Tesla for nuclei hydrogen $^1$H), a PIN diode functions as an electric component whose RF impedance is an inverse function of a forward DC current flowing through it. Therefore, the RF impedance can be readily controlled between a substantially electrically non-conducting state and a substantially electrically conducting state by variation of the bias current. A ratio of radio frequency impedances of the PIN diode in the two states can regularly be larger than 500, preferably larger than 1.000, and, most preferably, larger than 10.000.

In this way, the electrical signals from, to or within the at least one of the at least one MR radio frequency antenna device and from, to or within the at least one of the at least one metal detector coil can effectively be directed by using cost-effective means.

In one embodiment, the at least one metal detector coil comprises a plurality of turns, which are interconnected by a plurality of capacitors having a low impedance in a frequency region about a Larmor frequency and a high impedance at a fundamental signal frequency of the metal detector unit, and wherein the at least one metal detector coil, in at least one state of operation, serves as the at least one MR radio frequency antenna device.

Similar to the RF impedance of the PIN diodes mentioned before, a ratio of the impedance of the capacitors at the frequency region about the Larmor frequency and at the fundamental signal frequency preferably is larger than 500, more preferable larger than 1.000, and, most preferable, larger than 10.000.

In this way, the at least one metal detector coil can, in two different states of operation, serve two purposes, depending on the frequency of the signal that it is provided with: on the one hand as a metal detector coil, and on the other hand as an MR radio frequency antenna device, which is beneficially part-saving, and, further, has the advantage of a position of the metal detector coil being identical to a position of the MR radio frequency antenna device.

Preferably, the plurality of turns of the at least one metal detector coil is arranged in a substantially planar manner. By that, the plurality of capacitors can readily be arranged in the same plane as the plurality of turns, which facilitates an easy installation.

In one embodiment, the plurality of turns of the at least one metal detector coil is arranged on a two-dimensional curved surface, in particular a developable two-dimensional surface, which shall encompass at least a portion of an elliptical cylinder, in particular a circular cylinder, or a cone.

In another preferred embodiment, the magnetic resonance imaging system further comprises
- a magnetic gradient coil system configured for generating gradient magnetic fields superimposed to the static magnetic field $B_0$;
- a control unit for controlling functions of the magnetic resonance imaging system;
- a metal detector coil driving unit provided for electrically driving the at least one metal detector coil or the metal detector coil array, and
- a metal detector signal evaluation unit that is configured for evaluating signals received from the at least one metal detector coil or the metal detector coil array and for providing, on the basis of the evaluated signals, an output signal indicative of presence or absence of metal within the subject of interest to the control unit.

The control unit is configured to provide as a selectable option, on the basis of the output signal of the metal detector signal evaluation unit, at least one pulse sequence out of a pre-determined selection list of magnetic resonance pulse sequences.

The phrase "pulse sequence", as used in this application, shall in particular be understood to comprise at least one radio frequency power pulse characterized by specified radio frequency pulse parameter values, and at least one gradient pulse characterized by specified gradient pulse parameter values.

As is known in the art, the radio frequency power pulses are meant to be provided to at least one radio frequency transmit antenna to at least serve as a basis for applying a radio frequency excitation field $B_1$ to the nuclei of or within a portion of the subject of interest for the purpose of magnetic resonance excitation. Further, gradient pulses are meant to be provided to the magnetic gradient coil system of the magnetic resonance imaging system to at least serve as a basis for generating the gradient magnetic fields.

As is further known in the art, in a pulse sequence a fixed timely relationship exists between a radio frequency pulse or radio frequency power pulses and gradient pulses, and magnetic resonance pulse sequences are often repeated several times during a magnetic resonance scanning protocol.

The pre-determined selection list of magnetic resonance pulse sequences in case of a detected metal-comprising implant may comprise, but is not limited to, the following magnetic resonance pulse sequences: Turbo spin echo (TSE) pulse sequences, in particular having short echo spacing and high TSE factor; low water-fat separation; pulse sequences with strong slice selection gradient; increased number of signal averages; Short T1 Inversion Recovery (STIR) pulse sequences for fat suppression. In general, the pre-determined selection list provided in case of a detected metal-comprising implant may also include other magnetic resonance pulse sequences which are known to be robust with regard to an occurrence of artifacts when acquiring magnetic resonance signals near a metal-comprising implant, and that appear suitable to those skilled in the art.

In this way, in a suitable embodiment, in case of a detected metal-comprising implant the pre-determined selection list of magnetic resonance pulse sequences can beneficially be automatically confined to those magnetic resonance pulse sequences that are known to be robust with regard to an occurrence of artifacts for near-implant magnetic resonance imaging.

In one embodiment, the control unit is configured to provide, on the basis of the output signal of the metal detector signal evaluation unit, a pre-determined selection list of magnetic resonance pulse sequences.

In another embodiment of the magnetic resonance imaging system, at least one integral unit of an MR radio frequency antenna device and a metal detector coil or a metal detector coil array is arranged, in at least one state of operation, in at least one location out of
- in free space above the subject of interest, and
- attached to a patient table below the subject of interest.

In this way, a metal-comprising implant within the subject of interest can be detected prior to applying the radio frequency magnetic excitation field $B_1$, for a large number of applications of magnetic resonance imaging at organs of the subject of interest, such as imaging of the heart and other organs.

In another aspect of the present invention, a method of operating an embodiment of the magnetic resonance imaging system disclosed herein is provided.

The method comprises steps of
- activating the metal detector unit,
- evaluating signals received from the at least one metal detector coil or the metal detector coil array,
- generating an output signal that is at least indicative of presence or absence of metal within the subject of interest and providing the output signal to the control unit, and
  - providing as a selectable option, on the basis of the output signal of the metal detector signal evaluation unit, at least one pulse sequence out of the pre-determined selection list of magnetic resonance pulse sequences.

The same benefits apply for these disclosed methods as presented before for the corresponding magnetic resonance imaging systems.

In another embodiment, the method further includes steps of
- in case of indicated presence of metal within the subject of interest, calculating at least one out of a position, a size and a classification of the detected metal, based on signals received from the metal detector coil array, and transmitting data related to at least one out of the calculated position, size and classification of the detected metal to a human interface device of the magnetic resonance imaging system for visualization purposes.

In this way, an operator of the magnetic resonance imaging system is made aware of the presence of metal within the subject of interest, and of at least one out of the position of the metal-comprising implant with regard to the at least one MR radio frequency antenna device or the MR radio frequency antenna array, the size and the classification of the detected metal, by which a decision on further proceeding can be supported.

In yet another embodiment, the method comprises steps of
in case of indicated presence of metal within the subject of interest, estimating an expected specific absorption rate for a plurality of magnetic resonance pulse sequences out of the list of pre-determined magnetic resonance pulse sequences, and
compiling a selection list of magnetic resonance pulse sequences out of the plurality of magnetic resonance pulse sequences for which an estimated expected specific absorption rate is lower than or equal to a pre-defined threshold value.

In this way, it can be ensured that a specific absorption rate safety limit is kept that the subject of interest will be exposed to subsequent to the detection of the metal-comprising implant by applying one of the magnetic resonance pulse sequences out of the compiled selection list.

In one embodiment, the compiled selection list is visualized to the operator of the magnetic resonance imaging system at a human interface.

In one embodiment, the compiled selection list of magnetic resonance pulse sequences and their corresponding estimated expected specific absorption rates are provided to the control unit, and the control unit is configured to perform a ranking of the magnetic resonance pulse sequences, depending on at least one pre-defined criterion. The pre-defined criterion may be selected from a list including, but not limited to, absolute value of the expected specific absorption rate and signal-to-noise ratio. The control unit is further configured to visualize the ranking of the magnetic resonance pulse sequences to the operator.

In yet another aspect of the present invention, a software module is provided for carrying out steps of an embodiment of the disclosed method of operating a magnetic resonance imaging system with regard to detecting metal-comprising implants and selecting magnetic resonance pulse sequences. The method steps to be conducted are converted into a program code of the software module, wherein the program code is implementable in a memory unit of the control unit and is executable by a processor unit of the control unit. The control unit may be the control unit of the magnetic resonance imaging system. The control unit may, alternatively or supplementary, be another control unit that is especially assigned to execute at least some of the method steps.

The software module can enable a robust and reliable execution of the method and can allow for a fast modification of method steps.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
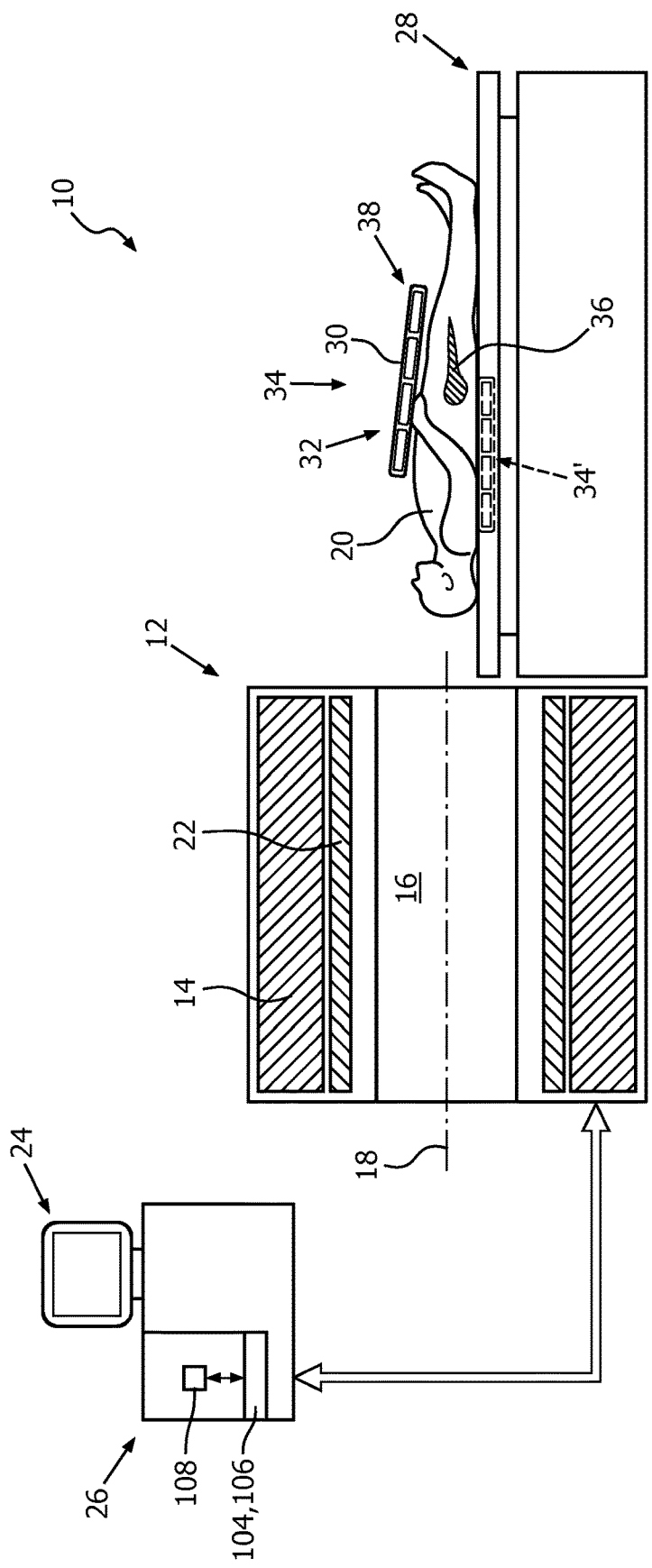
FIG. 1 shows a schematic illustration of an embodiment of a magnetic resonance imaging system in accordance with the invention.

FIG. 1 shows a schematic illustration of an embodiment of a magnetic resonance imaging system 10 in accordance with the invention. The magnetic resonance imaging system 10 is configured for acquiring magnetic resonance images from at least a portion of a subject of interest 20, usually a patient. The magnetic resonance imaging system 10 comprises a scanner unit 12 having a main magnet 14. The main magnet 14 has a central bore that provides an examination space 16 around a center axis 18 for the subject of interest 20 to be positioned within, and is further configured for generating a static magnetic field $B_0$ at least in the examination space 16. The static magnetic field $B_0$ defines an axial direction usually denoted as the direction of the z-axis and aligned in parallel to the center axis 18 of the examination space 16.

A customary patient table 28 for supporting the subject of interest 20 includes a table support and a table top that is attached to the table support in a slidable manner. The subject of interest 20, while being supported by the table top, can be transferred between positions within the examination space 16 and positions outside the examination space 16, as shown in FIG. 1.

Further, the magnetic resonance imaging system 10 comprises a magnetic gradient coil system 22 configured for generating gradient magnetic fields superimposed to the static magnetic field $B_0$. The magnetic gradient coil system 22 is concentrically arranged within the bore of the main magnet 14 and comprises a plurality of coils to generate gradient magnetic fields in three dimensions, as is known in the art.

Although this specific embodiment of the invention is described to be applied to a magnetic resonance imaging system 10 of the bore type, it will be appreciated by those skilled in the art that the invention is also applicable to any other type of magnetic resonance imaging system.

The magnetic resonance imaging system 10 comprises a control unit 26 provided to control functions of the scanner unit 12, the magnetic gradient coil system 22, and other functions of the magnetic resonance imaging system 10. The control unit 26 includes a processor unit 108, a digital memory unit 106 and several human interface devices 24, including a monitor unit and a keyboard, provided for transferring information between the control unit 26 and an operator, usually a medical staff member.

Furthermore, the magnetic resonance imaging system 10 includes an MR radio frequency antenna device 30 designed as an MR radio frequency surface transmit/receive antenna that is configured for applying a radio frequency excitation field $B_1$ to nuclei of or within the subject of interest 20 for magnetic resonance excitation during radio frequency transmit time periods to excite the nuclei of or within the subject of interest 20 for the purpose of magnetic resonance imaging. To this end, the MR radio frequency antenna device 30 is connected to a radio frequency transmitter unit (not shown), and radio frequency power can be fed, controlled by the control unit 26, to the MR radio frequency antenna device 30.

The MR radio frequency antenna device 30 is further configured for receiving magnetic resonance signals during radio frequency receive time periods from nuclei of or within the portion of the subject of interest 20 that have been excited by applying a radio frequency excitation field $B_1$. In an operational state of the magnetic resonance imaging system 10, radio frequency transmit time periods and radio frequency receive time periods are taking place in a consecutive manner.

The radio frequency power of magnetic resonance radio frequency is provided to the MR radio frequency antenna device 30 via a radio frequency switching unit 82 (FIG. 4) during the radio frequency transmit time periods, as is known in the art. During the radio frequency receive time periods, the radio frequency switching unit 82, controlled by the control unit 26, directs the magnetic resonance signals from the MR radio frequency antenna device 30 to the control unit 26 for signal processing and for determining magnetic resonance images of at least the portion of the subject of interest 20 from the acquired magnetic resonance signals.

The MR radio frequency antenna device 30 comprises a plurality of MR coils 32 arranged as an MR radio frequency antenna array. A detailed view of one of the MR coils 32 of the MR radio frequency antenna device 30 is given in FIG. 3.

The magnetic resonance imaging system 10 further includes a metal detector unit 38 for detecting metal, in particular metal-comprising implants 36, within the subject of interest 20. The metal detector unit 38 (FIGS. 2 and 4) comprises a plurality of metal detector coils 40 arranged as a metal detector coil array, a metal detector coil driving unit 42 that is provided for electrically driving the plurality of metal detector coils 40 and a metal detector signal evaluation unit 44 that is configured for evaluating signals received from the metal detector coil array and for providing, on the basis of the evaluated signals, an output signal 46 indicative of presence or absence of metal within the subject of interest 20 to the control unit 26.

Referring back to FIG. 3, the MR radio frequency antenna device 30 and the metal detector coil 40 mechanically, electrically and spatially form an integral unit 34, as will be explained in the following.

Figure 3:
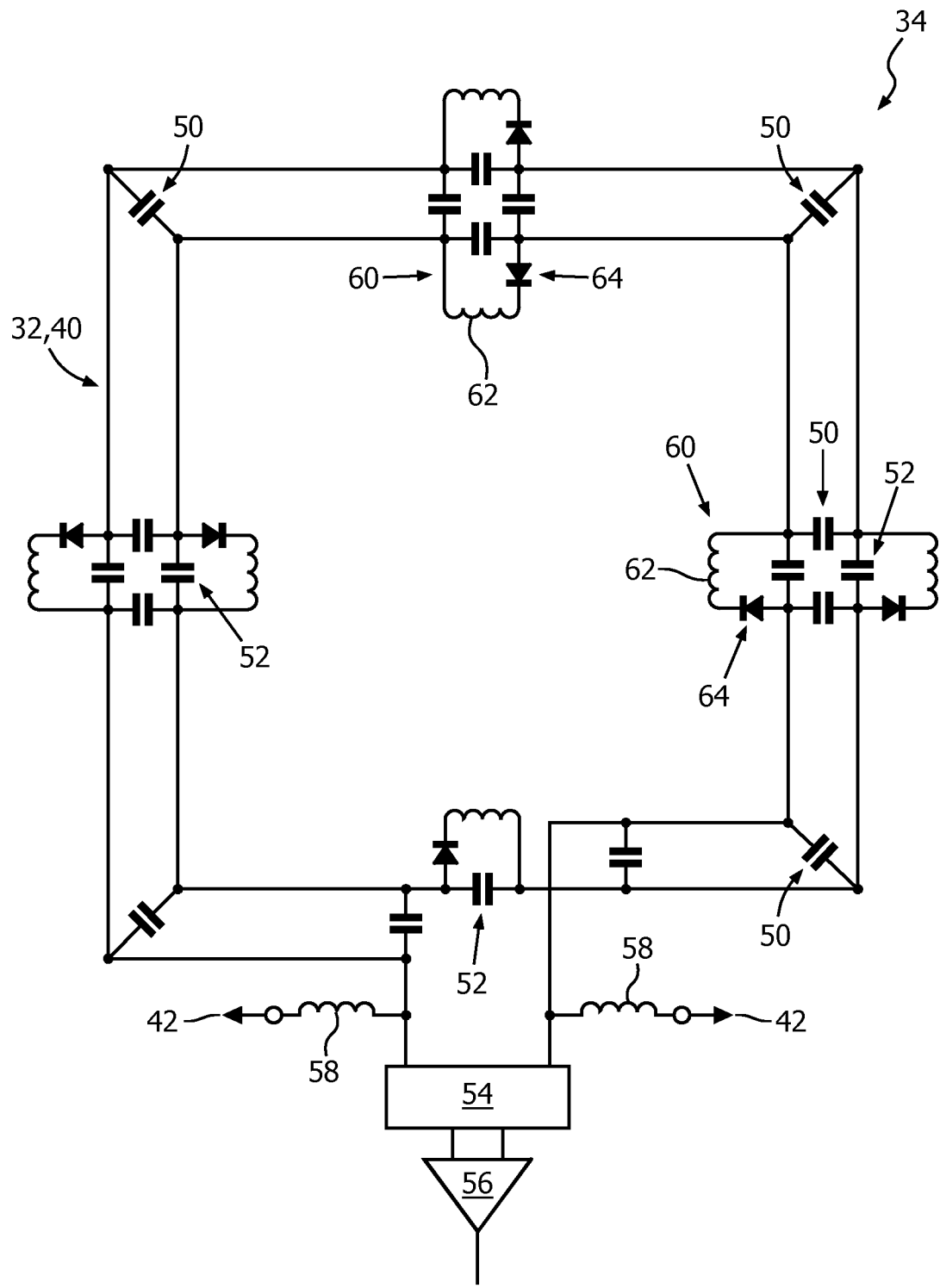

FIG. 3 shows a coil of rectangular shape with a planar winding comprising two turns. The turns of the planar winding are interconnected by a first plurality of capacitors 50 at the ends of the winding, in the middle of each edge and at the corners of the rectangular coil. Each one of the first plurality of capacitors 50 has low impedance in a frequency region about a Larmor frequency, and high impedance at a fundamental signal frequency of the metal detector driving unit 42. The ends of the planar winding are connected via an impedance match network 54 to a magnetic resonance pre-amplifier 56, and also via inductors 58 to the metal detector driving unit 42.

In the frequency region about the Larmor frequency, the turns of the planar winding are effectively shorted by the first plurality of capacitors 50, and thus form a rectangular magnetic resonance surface receive antenna having effectively one turn. The second plurality of capacitors 52 that are electrically arranged in series with the two turns of the planar winding serve, in combination with the one turn of the coil, the purpose of forming a resonant circuit that is tuned to the frequency region about the Larmor frequency.

In the frequency region about the fundamental signal frequency of the metal detector driving unit 42, the turns of the planar winding are electrically separated from each other, and thus form a rectangular metal detector coil 40 having effectively two turns.

Each one of the capacitors 52 of the second plurality of capacitors 52 has high impedance at the fundamental signal frequency of the metal detector driving unit 42. In order to be able to drive an electric current through the two turns of the rectangular metal detector coil 40, one electric filter member 60 of a plurality of electric filter members 60 is electrically connected in parallel to each capacitor 52 of the second plurality of capacitors 52. Each electric filter member 60 includes a choke 62 that is remotely switchable by a PIN diode 64 (the electronic circuits required for controlling the PIN diodes 64 have been omitted in FIG. 3 for the sake of clarity).

In one state of operation, the metal detector coil driving unit 42 provides an electrical signal formed by a square-wave current pulse of a fundamental signal frequency of 2 MHz to the ends of the planar winding, which induces an electric current from, to and within the transmission line forming the metal detector coil 40. The PIN diodes 64 are in a state of low radio frequency impedance, thus the chokes 62 of the electric filter members 60 form an electric bridge for the electrical signal around the capacitors 52 of the second plurality of capacitors 52. In this way, the electric filter members 60 direct the electric signal from, to and within the metal detector coil 40.

In another state of operation, the metal detector coil driving unit 42 does not provide any electrical signal to the ends of the planar winding. The PIN diodes 64 are in a state of high radio frequency impedance, thus the chokes of the electric filter members 60 form an open electrical connection. The effectively single turn of the rectangular magnetic resonance surface receive antenna is tuned to the Larmor frequency. The excited nuclei of or within the subject of interest 20 induce an electric signal that is directed by the electric filter members 60 from, to and within the transmission line forming the magnetic resonance surface receive antenna.

By switching the PIN diodes 64 between the states of high radio frequency impedance and low radio frequency impedance, the coil of rectangular shape with the planar winding comprising two turns can be transferred between a magnetic resonance mode, in which the coil functions as a single-turn MR radio frequency surface receive antenna for receiving magnetic resonance signals, and a metal detection mode, in which the coil functions as a metal detector coil 40, generating a magnetic field and picking up a magnetic field generated in response by metal present within the subject of interest 20.

In the specific embodiment shown in FIG. 1, the integral unit 34 formed by the magnetic resonance radio frequency antenna array and the metal detector coil array is arranged in free space above the subject of interest 20 as an anterior magnetic resonance antenna. In general, the integral unit 34 or an additional integral unit can be attached to the patient table 28 and can be arranged below the subject of interest 20 as a posterior magnetic resonance antenna (34'). In other embodiments, an integral unit may be located inside a patient mattress, cushion or patient clothing. The integral unit can be mechanically flexible such that its shape can reversibly be adapted to match that of a patient body.

Figure 2:
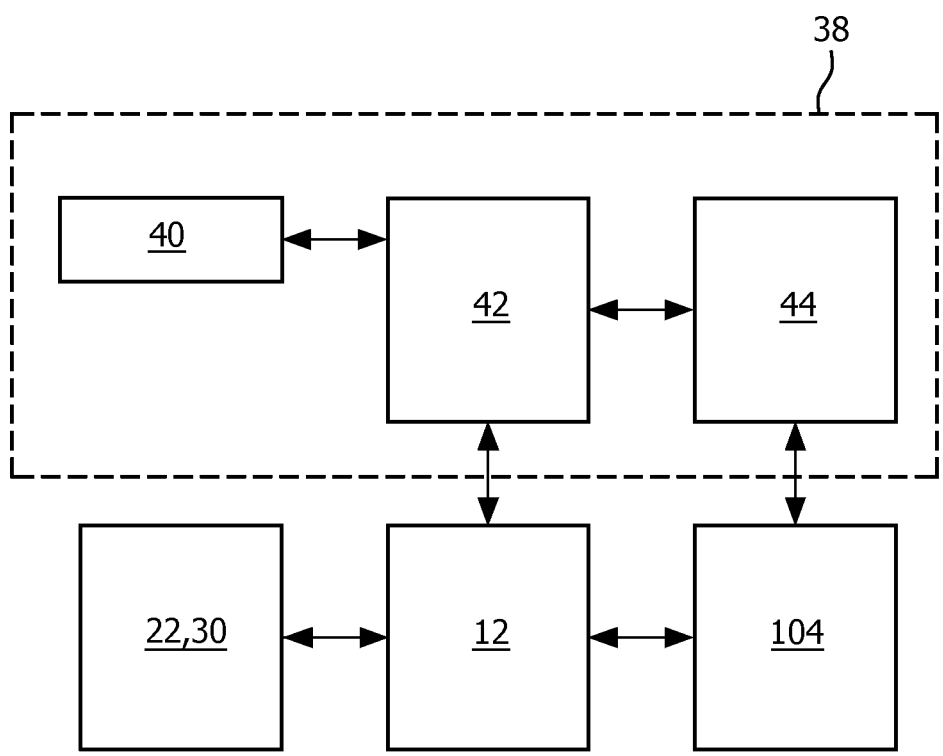
FIG. 2 shows a functional configuration of the magnetic resonance imaging system pursuant to FIG. 1, FIG. 3 schematically illustrates an integral unit of the magnetic resonance imaging system pursuant to FIG. 1, formed by a metal detector coil and a radio frequency receive antenna, FIG. 4 schematically illustrates the metal detector unit of the magnetic resonance imaging system pursuant to FIGS. 1 to 3.
Figure 4:
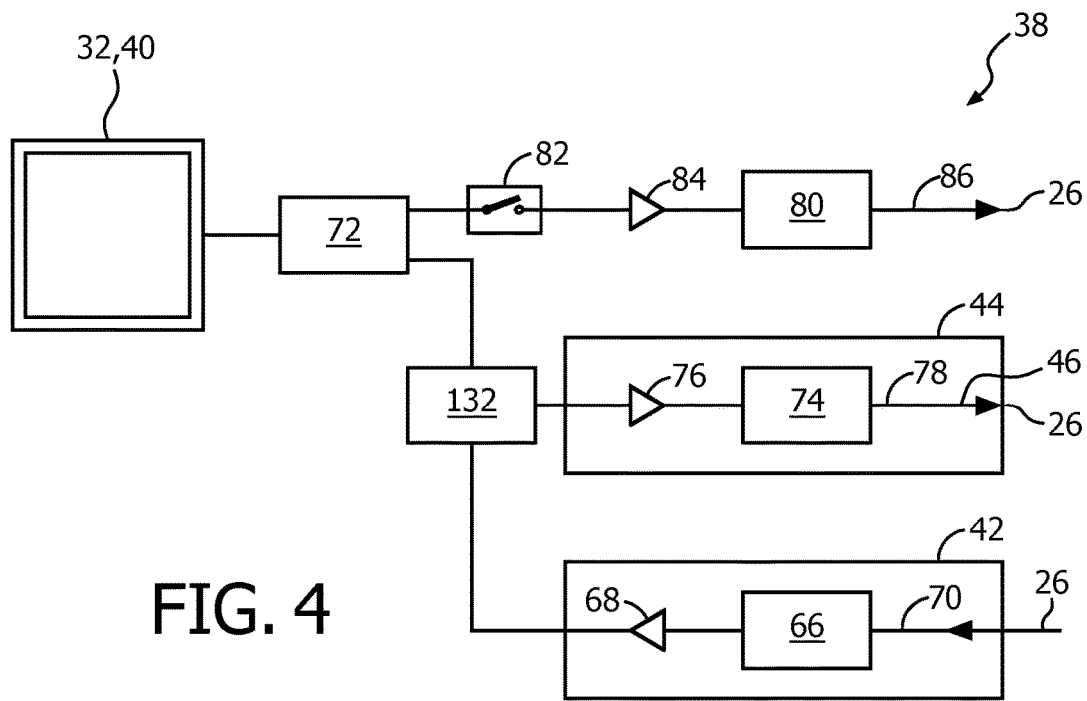

FIG. 4 schematically illustrates the metal detector unit 38 of the magnetic resonance imaging system 10 pursuant to FIGS. 1 to 3. The double square on the left-hand side symbolizes the coil of rectangular shape with the planar winding of two turns. The metal detector coil driving unit 42 includes a first field programmable gate array (FPGA) 66 and a digital-to-analog converter (DAC) for generating an electric output signal that is being amplified by an amplifier 68 for driving the metal detector coil array. The first FPGA 66 receives digital control signals from the control unit 26 via a fiber-optical data communication link 70.

Analog signals received by the metal detector coil array are directed via a diplexer 72 according to their frequency range and via a send/receive switch 132 controlled by the control unit 26 to the metal detector signal evaluation unit 44. The metal detector signal evaluation unit 44 comprises a pre-amplifier 76 for amplifying the analog signals, an analog-to-digital converter (ADC) and a second FPGA 74 for digitally converting the analog signals before they are transmitted via a second fiber-optical data communication link 78 to a processor unit (not shown) of the detector signal evaluation unit 44 for evaluating the received signals. The control unit 26 has data access to a pre-determined list of magnetic resonance pulse sequences, which list resides in a digital memory unit of the magnetic resonance imaging system 10, namely the digital memory unit 106 of the control unit 26. The control unit 26 is configured to provide, on the basis of the output signal 46 received from the metal detector signal evaluation unit 44, as options that are selectable by the operator of the magnetic resonance imaging system 10 a selection list of magnetic resonance pulse sequences out of the pre-determined list of magnetic resonance pulse sequences. The control unit 26 is configured to display the selection list to the operator on the monitor unit.

The upper part of FIG. 4 schematically illustrates a signal path for magnetic resonance signals received by the MR radio frequency surface receive antenna. The signal path comprises the radio frequency switching unit 82, a pre-amplifier 84, an ADC and a third FPGA 80 for digitally converting the amplified analog magnetic resonance signals before they are transmitted via a third fiber-optical data communication link 86 to the control unit 26.

Figure 5:
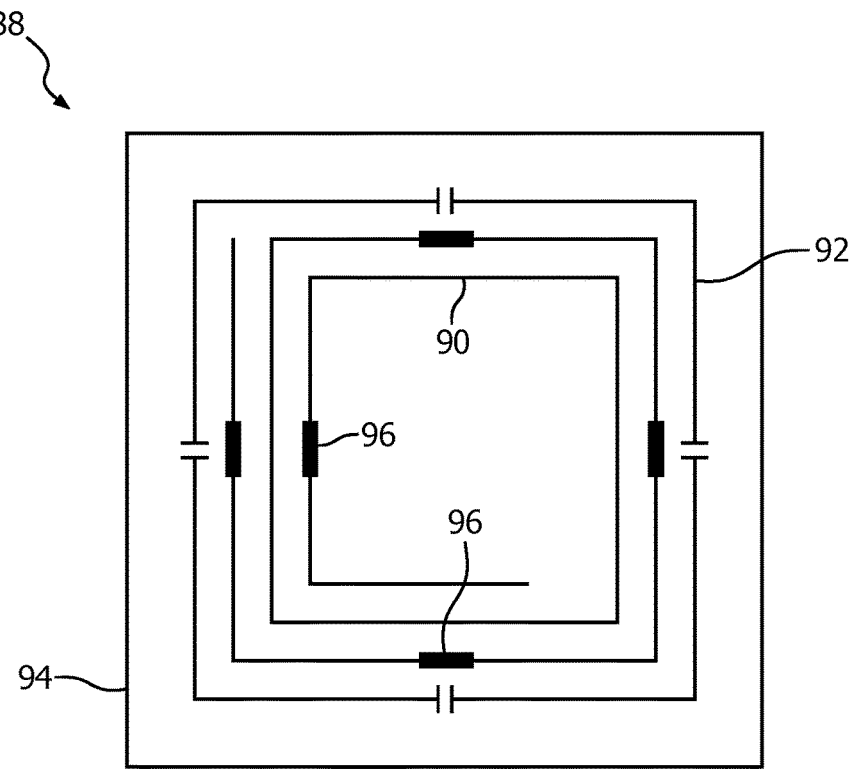
FIG. 5 shows a schematic illustration of an alternative integral unit.

FIG. 5 shows a schematic illustration of an alternative integral unit 88 formed by a metal detector coil 90 and an MR radio frequency antenna device 92 designed as an MR radio frequency surface receive antenna. The metal detector coil 90 is designed as a planar square coil. The integral unit 88 comprises a planar coil having 2½ turns. Both the metal detector coil 90 and the MR radio frequency surface receive antenna are arranged on a common carrier 94. The metal detector coil 90 includes a plurality of chokes 96 connected in series, which represent high impedance in the region about the Larmor frequency, and low impedance in the frequency region about the fundamental signal frequency of the metal detector driving unit 42.

Figure 6:
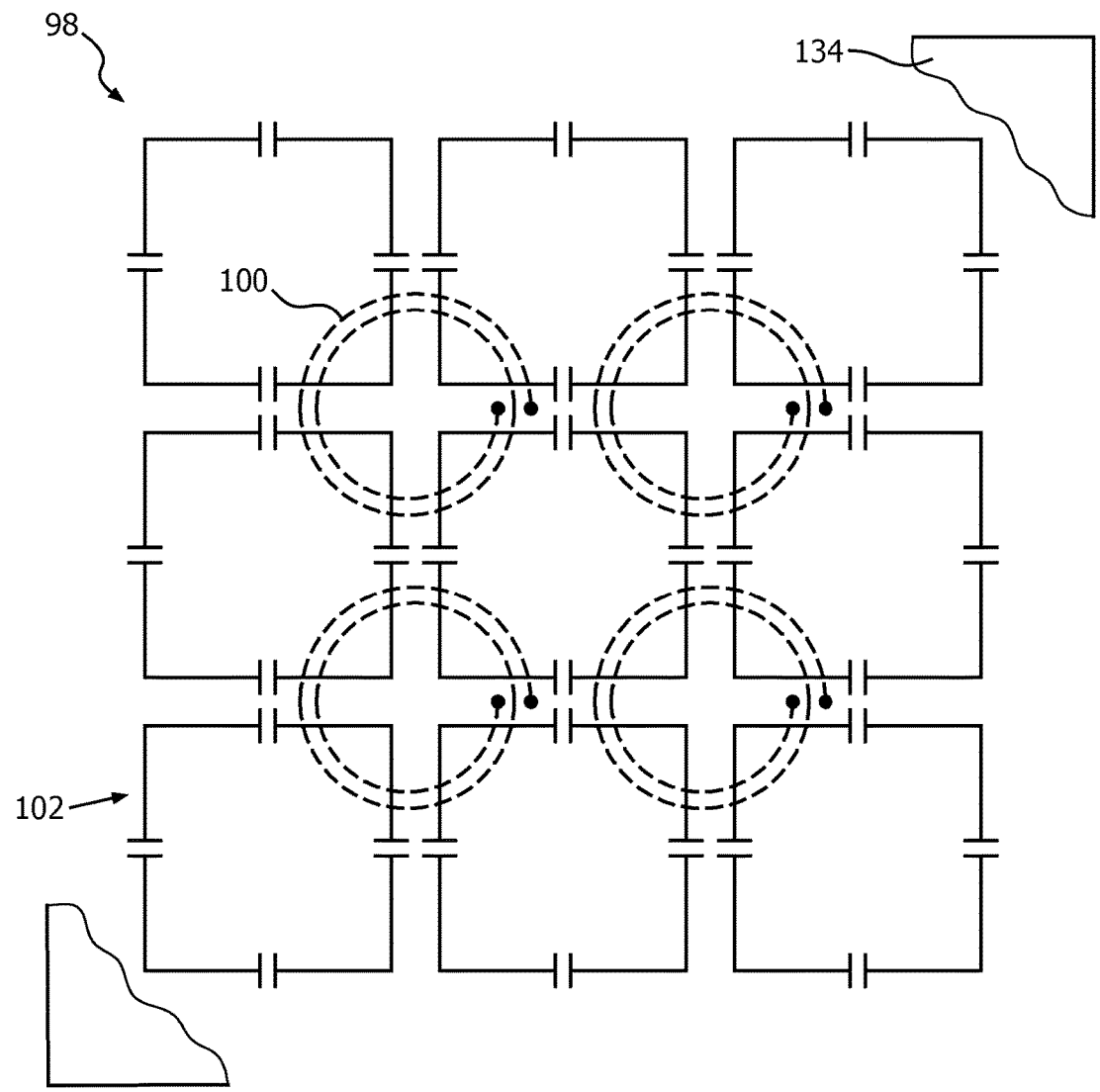
FIG. 6 shows a schematic illustration of another alternative integral unit.

Another alternative integral unit 98 is shown in a schematic illustration in FIG. 6. The integral unit 98 comprises an MR radio frequency antenna device 102 having nine square-shaped MR radio frequency surface receive antennas arranged as an array of 3×3, and four circular-shaped metal detector coils 100 arranged as an array of 2×2. Each of the metal detector coils 100 includes a plurality of chokes (not shown) connected in series as described for the embodiment pursuant to FIG. 5.

The array of magnetic resonance antennas and the array of detector coils 100 are arranged, electrically insulated from each other, at different levels on the surface of a common circuit board 134 as an electrically insulating carrier and mechanically form the integral unit 98, such that the metal detector coils 100 are arranged in a plane parallel to an orientation plane of the MR radio frequency surface receive antennas. Each one of the four metal detector coils 100 partially overlaps, in a direction perpendicular to the orientation plane, four MR radio frequency surface receive antennas for reducing or eliminating mutual inductances between the metal detector coils 100 and the MR radio frequency surface receive antennas. In this way, signal cross talk can be kept at a sufficiently low level.

The metal detector coils 100 can interact with each other by mutual coupling. Therefore, a metal detection sequence is usually performed sequentially for each one of the metal detector coils 100. During execution of a metal detection sequence at one of the metal detector coils 100, the other metal detector coils 100 are electrically switched off.

For accomplishing simultaneous metal detection with all metal detector coils 100, the individual metal detector coils 100 have to be mutually decoupled. This can be achieved by mutual electromagnetic decoupling of the individual metal detector coils 100 by using mutual overlap or by employing inductive transformers to minimize mutual coupling.

Alternatively, if the metal detector coils 100 are mutually electromagnetically coupled, all possible coupling coefficients could be measured in a calibration procedure, prior to executing metal detection. The calibration measurement can serve for compensating mutual coupling effects among the metal detector coils 100.

Similar to the embodiment pursuant to FIG. 5, the metal detector coils 100 of the metal detector coil array and the MR radio frequency antenna device 102 have separate transmission lines (not shown) for transferring signals from, to or within the metal detector coils 100 and the magnetic resonance device 102.

Alternatively, the array of magnetic resonance antennas may be arranged on the surface of a first circuit board as an electrically insulating carrier, and the array of detector coils may be arranged on the surface of the second circuit board, different from the first circuit board, and electrically insulating carrier, and the first circuit board and the second circuit board may be rigidly attached to each other for forming an integral unit.

The fact that there is already metal present in the vicinity of the metal detector coils 100, formed by the MR radio frequency antenna array, does not compromise the function of the metal detector unit 38, as it merely means a signal offset that is constant over time, and which can readily be compensated electronically.

Figure 7:
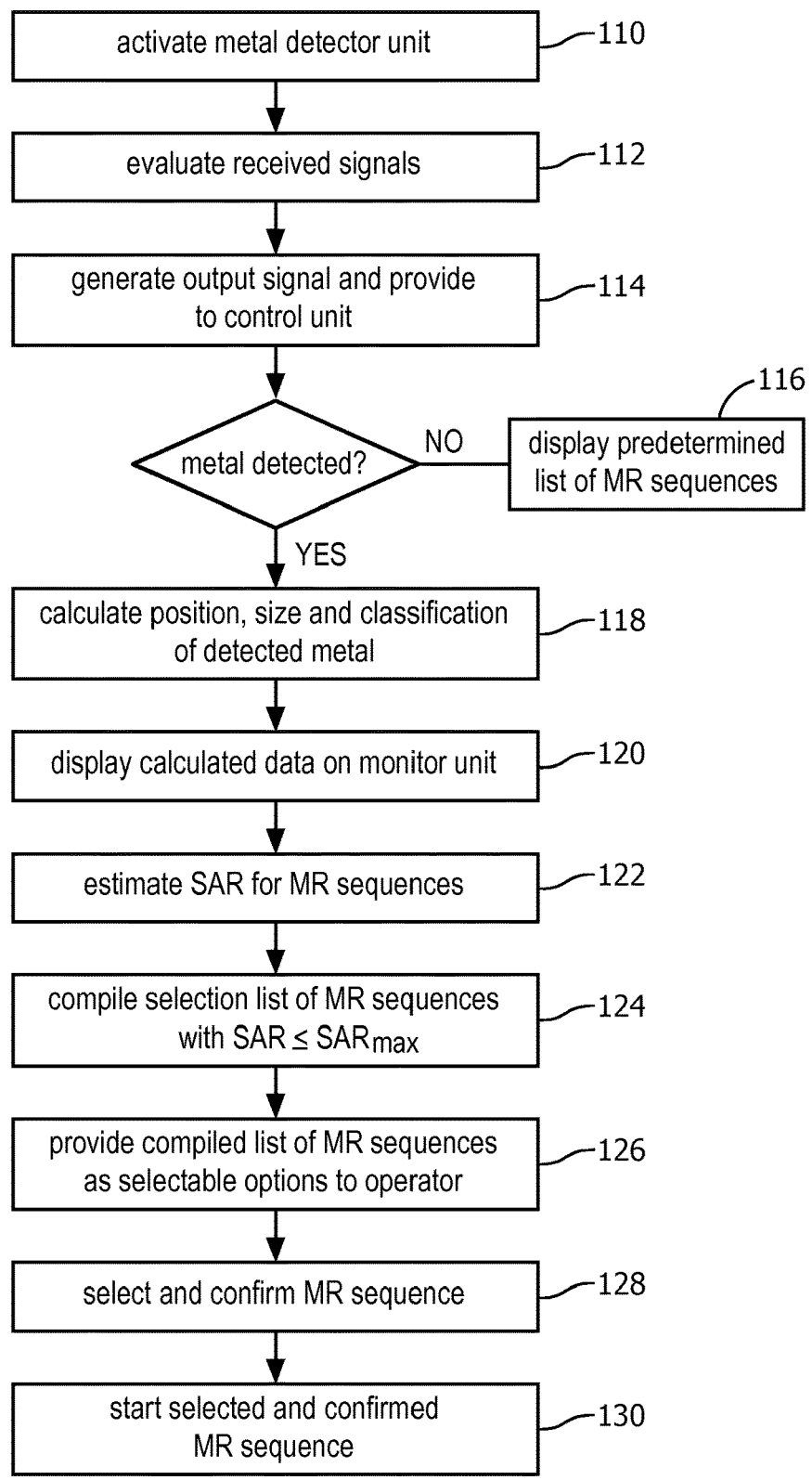
FIG. 7 illustrates a flow chart of an embodiment of the method in accordance with the invention.

In the following, an embodiment of a method of operating the magnetic resonance imaging system 10 with regard to detecting metal-comprising implants 36 and selecting magnetic resonance pulse sequences in accordance with the invention is described. A flow chart of the method is given in FIG. 7, and a functional configuration of the magnetic resonance imaging system 10 is illustrated in FIG. 2. It shall be understood that all involved units and devices are in an operational state and configured as illustrated in FIGS. 1 and 2.

In order to be able to carry out parts of the method, the control unit 26 comprises a software module 104 (FIG. 1). The method steps to be conducted are converted into a program code of the software module 104, wherein the program code is implemented in the digital memory unit 106 of the control unit 26 and is executable by the processor unit 108 of the control unit 26.

Prior to starting a magnetic resonance examination, the metal detector unit 38 is activated in a first step 110.

In a next step 112, signals received from the metal detector coil array are evaluated by the metal detector signal evaluation unit 44.

In another step 114, a signal 46 indicative of presence or absence of metal within the subject of interest 20 is generated at an output of the metal detector signal evaluation unit 44, and the output signal 46 is provided to the control unit 26.

If no presence of metal within the subject of interest 20 is detected, the control unit 26 displays a pre-determined selection list of magnetic resonance pulse sequences on the monitor unit as selectable options in a next step 116.

In case of indicated presence of metal within the subject of interest 20, the metal detector signal evaluation unit 44 calculates position, size and classification of the detected metal, based on signals received from the metal detector coil array in a next step 118.

This data is transmitted to the control unit 26 and displayed on the monitor unit for informing the operator in a next step 120.

In another step 122, the control unit 26 estimates an expected specific absorption rate for a plurality of magnetic resonance pulse sequences out of the pre-determined selection list of magnetic resonance pulse sequences.

In a next step 124, the control unit 26 compiles a selection list of magnetic resonance pulse sequences out of the plurality of magnetic resonance pulse sequences for which the estimated expected specific absorption rate is lower than or equal to a pre-defined threshold value.

In another step 126, the control unit 26 provides the compiled selection list of magnetic resonance pulse sequences with an estimated expected specific absorption rate lower than the threshold value as selectable options.

In a final step 130 after a step 128 of selecting or confirming one of the magnetic resonance pulse sequences out of the compiled selection list by the operator, the control unit 26 starts the selected or confirmed magnetic resonance pulse sequence.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST

| | |
|---|---|
| 10 | magnetic resonance imaging system |
| 12 | scanner unit |
| 14 | main magnet |
| 16 | examination space |
| 18 | center axis |
| 20 | subject of interest |
| 22 | magnetic gradient coil system |
| 24 | human interface device |
| 26 | control unit |
| 28 | patient table |
| 30 | MR radio frequency antenna device |
| 32 | MR coil |
| 34 | integral unit |
| 36 | metal-comprising implant |
| 38 | metal detector unit |
| 40 | metal detector coil |
| 42 | metal detector coil driving unit |
| 44 | metal detector signal evaluation unit |
| 46 | output signal |
| 48 | metal detector coil array |
| 50 | capacitors ($1^{st}$ plurality) |
| 52 | capacitors ($2^{nd}$ plurality) |
| 54 | impedance match network |
| 56 | pre-amplifier |
| 58 | inductor |
| 60 | electric filter member |
| 62 | choke |
| 64 | PIN diode |
| 66 | FPGA ($1^{st}$) |
| 68 | amplifier |
| 70 | fiber-optical data link |
| 72 | diplexer |
| 74 | FPGA ($2^{nd}$) |
| 76 | pre-amplifier |
| 78 | fiber-optical data link |
| 80 | FPGA ($3^{rd}$) |
| 82 | radio frequency switching unit |
| 84 | pre-amplifier |
| 86 | fiber-optical data link |
| 88 | integral unit |
| 90 | metal detector coil |
| 92 | MR radio frequency antenna device |
| 94 | carrier |
| 96 | choke |
| 98 | integral unit |
| 100 | metal detector coil |
| 102 | MR radio frequency antenna device |
| 104 | software module |
| 106 | digital memory unit |
| 108 | processor unit |
| | Steps of |
| 110 | activating metal detector unit |
| 112 | evaluating received signals |
| 114 | generating output signal |
| 116 | displaying selection list |
| 118 | calculating position, size, classification of detected metal |
| 120 | displaying calculated data |
| 122 | estimating expected SARs |
| 124 | compiling selection list |
| 126 | providing compiled selection list |
| 128 | selecting or confirming MR pulse sequence |
| 130 | starting MR pulse sequence |
| 132 | send/receive switch |
| 134 | circuit board |
| $B_0$ | static magnetic field |
| $B_1$ | radio frequency magnetic excitation field |

The invention claimed is:

1. A magnetic resonance imaging system configured for acquiring magnetic resonance images of at least a portion of a subject of interest, comprising:
   at least one magnetic resonance radio frequency antenna device that is designed as at least one out of
      a magnetic resonance radio frequency surface transmit antenna connectable to a radio frequency transmitter and being configured for receiving radio frequency power from the radio frequency transmitter and for applying a radio frequency excitation field $B_1$ in a high-frequency frequency band to nuclei of or within the portion of the subject of interest for magnetic resonance excitation, and
      a magnetic resonance radio frequency surface receive antenna that is configured for receiving magnetic resonance signals in the high-frequency frequency band from nuclei of or within the portion of the subject of interest that have been excited by applying a radio frequency excitation field $B_1$, and
   at least one metal detector unit for detecting metal within the subject of interest and including at least one metal detector coil, that is tunable to be resonant in a low-frequency band and wherein the at least one magnetic resonance radio frequency antenna device and the at least one metal detector coil mechanically or electrically or spatially form an integral unit.

2. The magnetic resonance imaging system as claimed in claim 1, wherein the at least one metal detector coil of the least one metal detector unit has a detector coil area that is arranged in a plane parallel to an orientation plane of the at least one magnetic resonance radio frequency surface receive antenna such that the detector coil area at least partially overlaps the at least one magnetic resonance radio frequency surface receive antenna in a direction perpendicular to the orientation plane.

3. The magnetic resonance imaging system as claimed in claim 1, wherein the at least one magnetic resonance radio frequency antenna device comprises a plurality of magnetic resonance coils arranged as a magnetic resonance radio frequency antenna array, and wherein the at least one metal detector unit comprises a plurality of metal detector coils arranged as a metal detector coil array.

4. The magnetic resonance imaging system as claimed in claim 1, wherein electric signals from, to or within the at least one magnetic resonance radio frequency antenna device and from, to or within at least one of the at least one metal detector coil are at least partially transferred via identical transmission lines, and further comprising at least one electric filter member for directing the electrical signals from, to or within the at least one of the at least one magnetic resonance radio frequency antenna device and from, to or within the at least one of the at least one metal detector coil.

5. The magnetic resonance imaging system as claimed in claim 4, wherein the at least one electric filter member includes at least one remotely switchable choke.

6. The magnetic resonance imaging system as claimed in claim 2, wherein the at least one metal detector coil comprises a plurality of turns, which are interconnected by a plurality of capacitors having a low impedance in a frequency region about a Larmor frequency and a high impedance at a fundamental signal frequency of the metal detector unit, and wherein the at least one metal detector coil, in at least one state of operation, serves as the at least one magnetic resonance radio frequency surface transmit antenna or magnetic resonance radio frequency surface receive antenna.

7. The magnetic resonance imaging system as claimed in claim 1, further comprising:
   a magnetic gradient coil system configured for generating gradient magnetic fields superimposed to the static magnetic field $B_0$;
   a control unit for controlling functions of the magnetic resonance imaging system;
   a metal detector coil driving unit provided for electrically driving the at least one metal detector coil or the metal detector coil array, and
   a metal detector signal evaluation unit that is configured for evaluating signals received from the at least one metal detector coil or the metal detector coil array and for providing, on the basis of the evaluated signals, an output signal indicative of presence or absence of metal within the subject of interest to the control unit,
   wherein the control unit is configured to provide as a selectable option, on the basis of the output signal of the metal detector signal evaluation unit, at least one magnetic resonance pulse sequence out of a pre-determined selection list of magnetic resonance pulse sequences.

8. The magnetic resonance imaging system as claimed in claim 1, wherein at least one integral unit of a magnetic resonance radio frequency antenna device and a metal detector coil or a metal detector coil array is arranged, in at least one state of operation, in at least one location out of
   in free space above the subject of interest, and
   attached to a patient table below the subject of interest.

9. A method of operating, with regard to detecting metal-comprising implants and selecting magnetic resonance pulse sequences, a magnetic resonance imaging system as claimed in claim 1, the method comprising steps of
   activating the metal detector unit,
   evaluating signals received from the at least one metal detector coil or the metal detector coil array,
   generating an output signal that is at least indicative of presence or absence of metal within the subject of interest and providing the output signal to the control unit, and
   providing as a selectable option, on the basis of the output signal of the metal detector signal evaluation unit at least one pulse sequence out of the pre-determined selection list of magnetic resonance pulse sequences.

10. The method of operating a magnetic resonance imaging system as claimed in claim 9, the method further comprising steps of
   in case of indicated presence of metal within the subject of interest, calculating at least one out of a position, a size and a classification of the detected metal, based on signals received from the metal detector coil array, and
   transmitting data related to at least one out of the calculated position, size and classification of the detected metal to a human interface device of the magnetic resonance imaging system for visualization purposes.

11. The method of operating a magnetic resonance imaging system as claimed in claim 9, the method comprising steps of
   in case of indicated presence of metal within the subject of interest, estimating an expected specific absorption rate for a plurality of magnetic resonance pulse sequences out of the pre-determined list of magnetic resonance pulse sequences, and
   compiling a selection list of magnetic resonance pulse sequences out of the plurality of magnetic resonance pulse sequences for which an estimated expected specific absorption rate is lower than or equal to a predefined threshold value.

12. A software module for carrying out the method as claimed in claim 9, wherein the method steps to be conducted are converted into a program code of the software module, wherein the program code is implementable in a digital memory unit of the magnetic resonance imaging system and is executable by a processor unit of the magnetic resonance imaging system.

* * * * *